United States Patent
Ito et al.

(10) Patent No.: US 6,372,612 B1
(45) Date of Patent: Apr. 16, 2002

(54) METHOD FOR MANUFACTURING SEMICONDUCTOR CIRCUIT

(75) Inventors: Minoru Ito, Fukaya; Takafumi Nakamura, Hino; Masanori Harada, Fukaya, all of (JP)

(73) Assignee: Kabushiki Kaisha Toshiba, Kanagawa-Ken (JP)

(*) Notice: Subject to any disclaimer, the term of this patent is extended or adjusted under 35 U.S.C. 154(b) by 0 days.

(21) Appl. No.: 09/668,739

(22) Filed: Sep. 25, 2000

(30) Foreign Application Priority Data

Sep. 24, 1999 (JP) .......................... 11-271221
Sep. 18, 2000 (JP) ........................ 2000-281158

(51) Int. Cl.⁷ ............................................... H01L 21/20
(52) U.S. Cl. ................................... 438/486; 438/795
(58) Field of Search ........................... 438/166, 486, 438/160, 480

(56) References Cited

U.S. PATENT DOCUMENTS

| 5,960,323 | A | * | 9/1999 | Wakita et al. | ............... | 438/795 |
| 6,165,824 | A | * | 12/2000 | Takano et al. | ............... | 438/160 |
| 6,221,701 | B1 | * | 4/2001 | Yamazaki | ................ | 438/166 |
| 6,259,120 | B1 | * | 4/2001 | Zhang et al. | ................ | 257/72 |
| 6,232,156 | B1 | * | 5/2001 | Ohtani et al. | ............... | 438/151 |

FOREIGN PATENT DOCUMENTS

JP 2746411 2/1998

* cited by examiner

*Primary Examiner*—David Nelms
*Assistant Examiner*—Thao P Le
(74) *Attorney, Agent, or Firm*—Pillsbury Winthrop LLP (57) ABSTRACT

An object of the present invention is to provide a method for manufacturing a semiconductor circuit by which a TFT including particles having a different threshold value is prevented from being operated even if such a TFT is locally formed.

According to the present invention, after forming an amorphous silicon layer on a glass substrate, heat treatment and the like is performed to convert the amorphous silicon layer into a polycrystalline silicon layer. At this time, a particle having an abnormal grain diameter is generated in a polycrystalline silicon layer under the influence of foreign particles in a glass substrate, and a TFT having a different threshold value may be formed. In this case, when the particle having an abnormal grain diameter is irradiated with a laser beam to be turned into a granule and a high resistance is given therearound, the TFT having a different threshold value is prevented from being operated, and a leak current does not flow during the off state of the original TFT, thereby improving the display characteristic.

11 Claims, 6 Drawing Sheets

METHOD FOR MANUFACTURING SEMICONDUCTOR CIRCUIT

CROSS REFERENCE TO RELATED APPLICATIONS

The subject application is related to subject matter disclosed in Japanese Patent Applications No. H11-271221 filed on Sep. 24, 1999 and No. H12-281158 filed on Sep. 18, 2000 in Japan to which the subject application claims priority under Paris convention and which is incorporated herein by reference.

BACKGROUND OF THE INVENTION (i) Field of the Invention

The present invention relates to a technique for compensating turbulence in crystallinity produced in a process for crystallizing an amorphous layer formed on an insulating substrate, and more particularly to) a repair technique of , e.g., an analog switch for driving a signal line of a liquid crystal (ii) Description of the Related Art Since a liquid crystal display has significant advantages such as high picture equality reduction in width and weight, and low-consumption power, it ;s widely used in .a notebook-size personal computer or a mobile electronic device and the like. In particular, development and research of a liquid crystal display in which a thin film transistor (which will be referred to as a TFT hereinafter) consisting of polycrystalline silicon with the high mobility is used for a switching device for displaying pixels or a switching device for driving a signal line have been performed at full blast in recent years.

In this kind of liquid crystal display, after forming an amorphous silicon layer on a top face of a glass substrate, the heat treatment and the like is carried out to convert the amorphous silicon layer into a polycrystalline silicon layer, and a part of the polycrystalline silicon layer is utilized as a channel region of the TFT.

Since the TFT consisting of the polycrystalline silicon can reduce the device size, high integration is possible and a high-resolution liquid crystal display can be realized. Further, since the nobility is high, it can be used as a TFT for a drive circuit and there is such an advantage as that a pixel array portion and a drive circuit can be integrally formed on the same substrate.

In order to uniformly form the TOT consisting of the polycrystalline silicon across a large area, there is required a crystallization process by which a semiconductor layer such as an amorphous silicon layer formed on the glass substrate is solid-phase-grown to be crystallized. However, since the glass substrate includes a lot of foreign particles such as protrusions or glass holes, the particle shape of the polycrystalline silicon layer may become uneven, thereby generating particles having an abnormal grain diameter. As a result, there is a problem such that the T including the particles having a different threshold value is locally formed in the channel region.

In particular, an analog switch for writing a pixel signal on a video bus in a video signal line has a large channel width W because it requires a large current. Accordingly, it is apt to be affected by foreign particles and the like in the glass substrate. Because of this, the TFT including the particles having a different threshold value is locally apt to formed.

When the above-described TFT including the particles having a different threshold value if formed to the TFT constituting an analog switch, a leak current is produced when the off state should be maintained. The analog switch can not be hence completely turned off, thereby deteriorating the display characteristic .

A fluctuation ink threshold value due to foreign particles or small glass holes and the like in the glass substrate can be suppressed to some degree by improving a method for cleaning the glass surface or a method for manufacturing glass. However a spin type cleaning method has a problem such that a cleaning liquid becomes a minute liquid, i.e., misty state during rotation and again falls in a given point in time in cleaning to contaminate the surface, and both generation of mists and re-falling can not be completely avoided.

In addition, the high cost can be expected for improvement of the glass manufacturing method, which makes it difficult to reduce the cost of the liquid crystal display.

On the other hand, Japanese patent application laid-open No 2746411 discloses a technique by which the display state of a display element is estimated, and a light beam having an irradiation amount based on the estimation result is irradiated with all regions of the thin film transistor having a drifted threshold value, and then adjustment by TFT drift current is performed in order to uniformize the threshold voltage of the TFT.

However, this document relates to a method for adjusting the drift of the threshold voltage of the TFT by the space charge, and the method by this document is different from a method for adjusting the drain current leak of the TFT by the above-mentioned abnormal particle.

SUMMARY OF THE INVENTION

In view of the above described drawbacks, an object of the present invention is to provide a method for manufacturing a semiconductor circuit for improving a manufacture yield ratio by suppressing the operation of TFTs including the particles having different threshold values when these TFTs are locally formed.

To achieve this aim is a method for manufacturing a semiconductor circuit comprising:

a semiconductor layer including a channel region, and source and drain regions arranged via the channel region on one main surface;

a gate electrode arranged on the channel region via an insulating film;

a source electrode electrically connected to the source a drain electrode electrically connected to the drain region, the method comprising a step for changing crystallinity by selectively irradiating a partial region in the channel region of the semiconductor layer with an energy beam.

Further, there is provided a method for manufacturing a semiconductor circuit comprising:

a semiconductor layer including a channel region and source and drain regions arranged via the channel region on one main surface;

a gate electrode arranged on the channel region via an insulating film;

a source electrode electrically connected to the source region; and a drain electrode electrically connected to the drain region, the method comprising a step for selectively heightening a resistance of a partial region in the channel region of the semiconductor layer.

Furthermore, there is provided a method for manufacturing a semiconductor circuit comprising;
  a semiconductor layer including a channel region, and source and drain regions arranged via the channel region on one main surface;
  a gate electrode arranged on the channel region via an insulating film;
  a source electrode electrically connected to the source region; and
  a drain electrode electrically connected to the drain region,
    the method comprising a step for selectively removing a partial region in the channel region of the semiconductor layer.

According to the present invention, since crystallinity of an active layer of a transistor is changed by irradiating the active layer with a laser beam, particles having an abnormal particle size are produced in the active layer under the influence of foreign particles in the insulating substrate Even if a region having a different threshold value is then generated around such a particle, the operation of the region having a different threshold value among the transistor can be restrained. That is, the abnormal region having a difference threshold value can not adversely affect the operation of an original transistor In particular, the transistor constituting an analog switch for driving a signal line had a large channel width to allow a flow of a large current and is hence apt to be affected by foreign particles in the insulating substrate. Therefore, particles having an abnormal particle size can be readily generated in the channel region However, even if they are produced, irradiating with a laser beam a region in which foreign particles are mixed can locally restrain the operation of this region, and the leak current does not flow when the transistor for peel display is turned off, thereby improving the display characteristic.

DESCRIPTION OF THE PREFERRED EMBODIMENTS

A method for manufacturing a semiconductor circuit according to the present invention will now be specifically described hereinafter with reference to the accompanying drawings Description will now be given as to a method for manufacturing an active matrix liquid crystal display using a TFT consisting of polycrystalline silicon as an example of the method for manufacturing a semiconductor circuit.

First Embodiment

Figure 1:
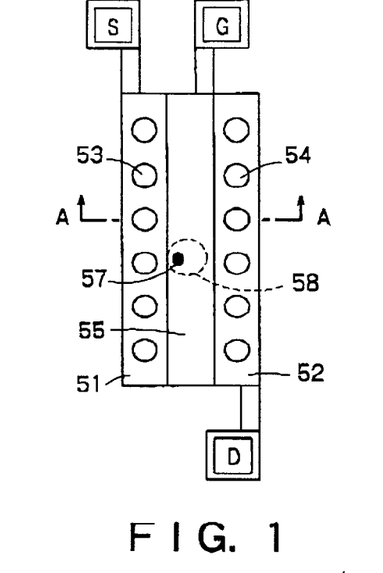
FIG. 1 is a view of a TFT in a liquid crystal display according to an embodiment of the present inventions the TFT shown from a back side of a glass substrate (enlarged view of analog switch part)
Figure 2:
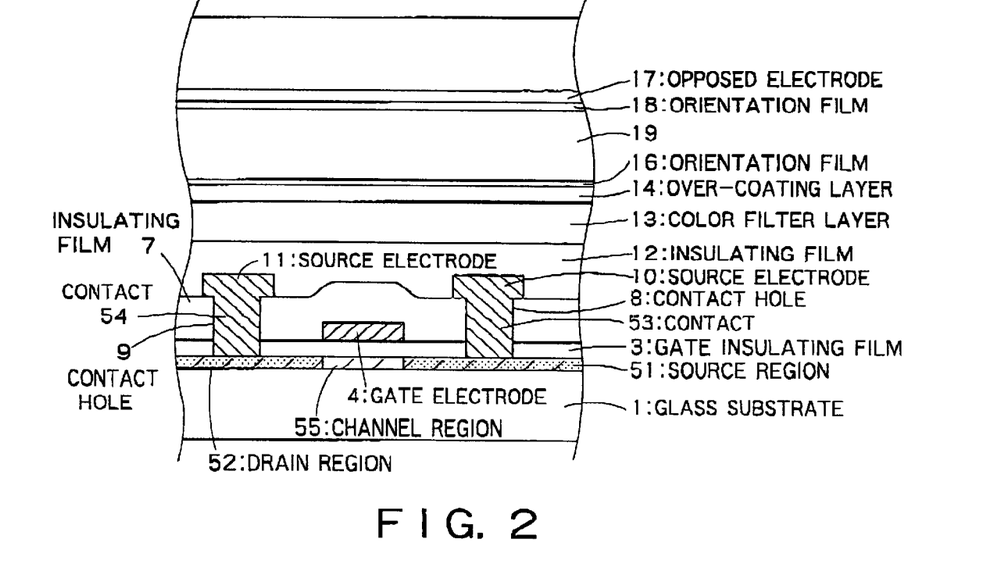
FIG. 2 is a cross-sectional view taken along the A—A line in FIG. 1.

FIG. 1 is a view of a TFT in a liquid crystal display according to an embodiment of the present invention. FIG. 1 shows a TFT for the analog switch formed on an array substrate of a liquid crystal display apparatus. FIG. 2 is a cross-sectional view taken along the A—A line in FIG. 1.

As shown in FIG. 1, a plurality of contacts 53 and 54 are formed in a source region 51 and a drain region 52, respectively, and the source region 51 is connected to the source electrode 10 through these contacts 53 and 54 while the drain region 52 is connected to a drain electrode 11.

A channel region 55 is formed between the source region 51 and the drain region 52, ice. , directly below a gate electrode (not shown in FIG. 1). FIG. 1 shows an example where a grain 57 having an abnormal grain size is generated in the channel region 55 under the influence of an foreign particle in a glass substrate 1.

As described in detail hereunder, the present embodiment is characterized in that the grain 57 having an abnormal grain size is turned into a granule by irradiating the grain 57 having an abnormal grain size with the laser around to limit the operation of the TFT in a region having a different threshold value generated by the grain 57.

Next, a manufacturing process of the liquid crystal display will be explained with reference to FIG. 3.

A film of amorphous silicon having a thickness of 30 nm to 100 nm is formed on the transparent substrate, for example, the glass substrate 1 by, for example, a plasma CVD method. Next, the amorphous silicon layer is converted into a polycrystalline silicon layer by energy irradiation, e.g., an excimer laser anneal method, and the polycrystalline silicon layer is thereafter etched in the shape of an island by a photolithography process to form a semiconductor layer 2 (FIG. 3A), Next, the top face of the semiconductor layer 2 is covered with a gate insulating film 3. The gate insulating film 3 is a silicon oxide film having a thickness of approximately 100 nm formed by, e.g., the plasma CVD method.

Next, a film of MoW alloy which can be a first wiring layer is formed on the top surface of the gate insulating film 3 by a sputtering method. The film of MoW alloy is etched by the photolithography process and a resist is peeled off to form a gate electrode 4 (FIG. 3B).

By using the gate electrode 4 of the first wiring layer as a mask, high-density doping of, e.g. boron is carried out. For doping, for example, ion implantation is carried out and a dose amount of approximately 2×1015 to 5×1016/cm2 is optimum. A source region 5 and a drain region 6 are formed in the semiconductor layer 2 by this ion implantation (FIG. 3B).

Next, the top face of the gate electrode 4 and the gate insulating f film 3 is then covered with an interlayer insulating film 7 using silicon oxide and the like as its material.

Figure 3A:
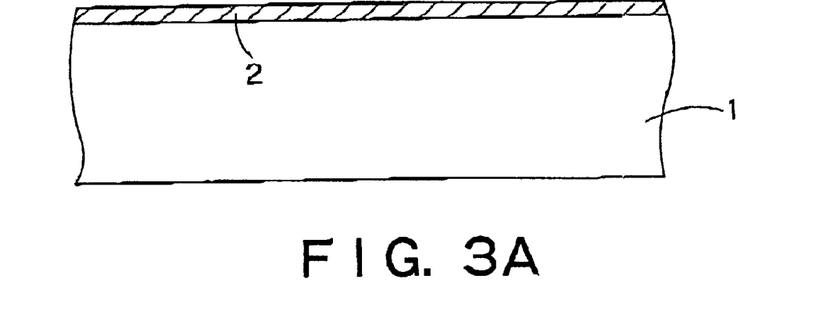
FIGS. 3A, 3B, and 3C are views showing a manufacture process of a TFT.
Figure 3B:
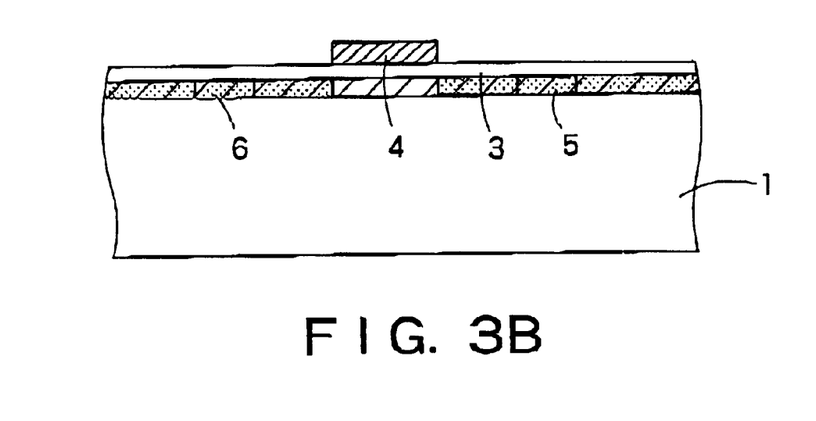
Figure 3C:
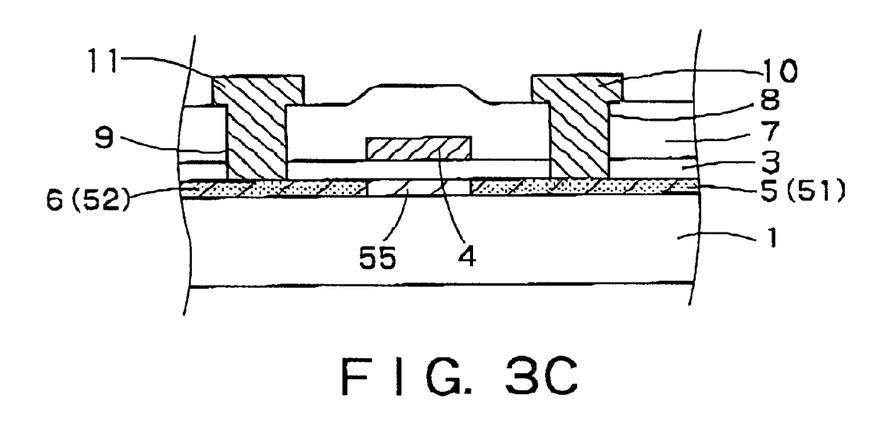

A partial region of the gate insulating film 3 above the source region 5 and the drain region 6 and a partial region of the interlayer insulating film 7 are then etched to be removed in the photolithography process so that contact holes 8 and 9 are formed (FIG. 3C).

Subsequently, a film of aluminium Al having a thickness of approximately 500 nm is formed as a second wiring layer an the top face of the interlayer insulating film 7 by sputtering and is etched by the photolithography process to form a source electrode 10, a drain electrode 11 and a signal wiring.

The source electrode 10 is connected to the source region 5 through the contact hole 8, and the drain electrode 11 is connected to the drain region 6 through the contact hole 9 (FIG. 3C). In this way, the TFT of the pixel section and a portion of the TFT of the driving circuit, for example, the TFTs for the analog switch are formed on the glass substrate 1.

An insulating film 12 is formed on the top face of the source electrode 10 and the drain electrode 11 as shown in FIG. 2. A color filter layer 13 is formed on the top face of the insulating film 12. An over-coating layer 14 is formed on the top face of the color filter layer 13. A pixel electrode 15 is formed in a portion corresponding to the display region on the top face or the over-coating layer 14. An alignment layer 16 is further formed on the pixel electrode 15. With these steps, an array substrate is completed. An opposed substrate arranged oppositely to the array substrate is provided with an opposed electrode 17 and an alignment layer 18 formed on the glass substrate. Between these substrates, a liquid crystal layer is sandwiched and sealed, thereby completing the liquid crystal display After completion of manufacture of the liquid crystal display, an inspection process is conducted. In the inspection process, a repair process for a display defective pixel and the like is carried out.

As mentioned above, in a case of performing a crystallization process for crystallizing the amorphous silicon layer, if a foreign particle such as a glass hole exists in the glass substrate 1, a grain having an abnormal grain size is produced in the polycrystalline silicon layer in consequence of this existence and a TFT including the region having a different threshold value is disadvantageously formed therearound.

In particular, since the transistor constituting an analog switch for driving a signal line has a large channel width for allowing a large current to flow, that transistor is apt to be affected by an foreign particle in the glass substrate 1, and the possibility that a grain having an abnormal grain size is generated in the channel region is high.

Irradiating the abnormal grain in the semiconductor layer 2 with the later provokes fusion/re-crystallization, and the grain having an abnormal grain size is turned into a granule to lower the mobility, thereby realizing high resistance therearound. The present applicant confirmed by an experiment that the TFT's operation of the locally formed region having a different threshold value is thus limited and the operation of the TFT being turned off can be consequently stabilized In this experiment, as a laser devices a laser repair device NRS-45 manufactured by N which generates a second harmonic of YAG laser having a wavelength of 532 nm is used.

Figure 4:
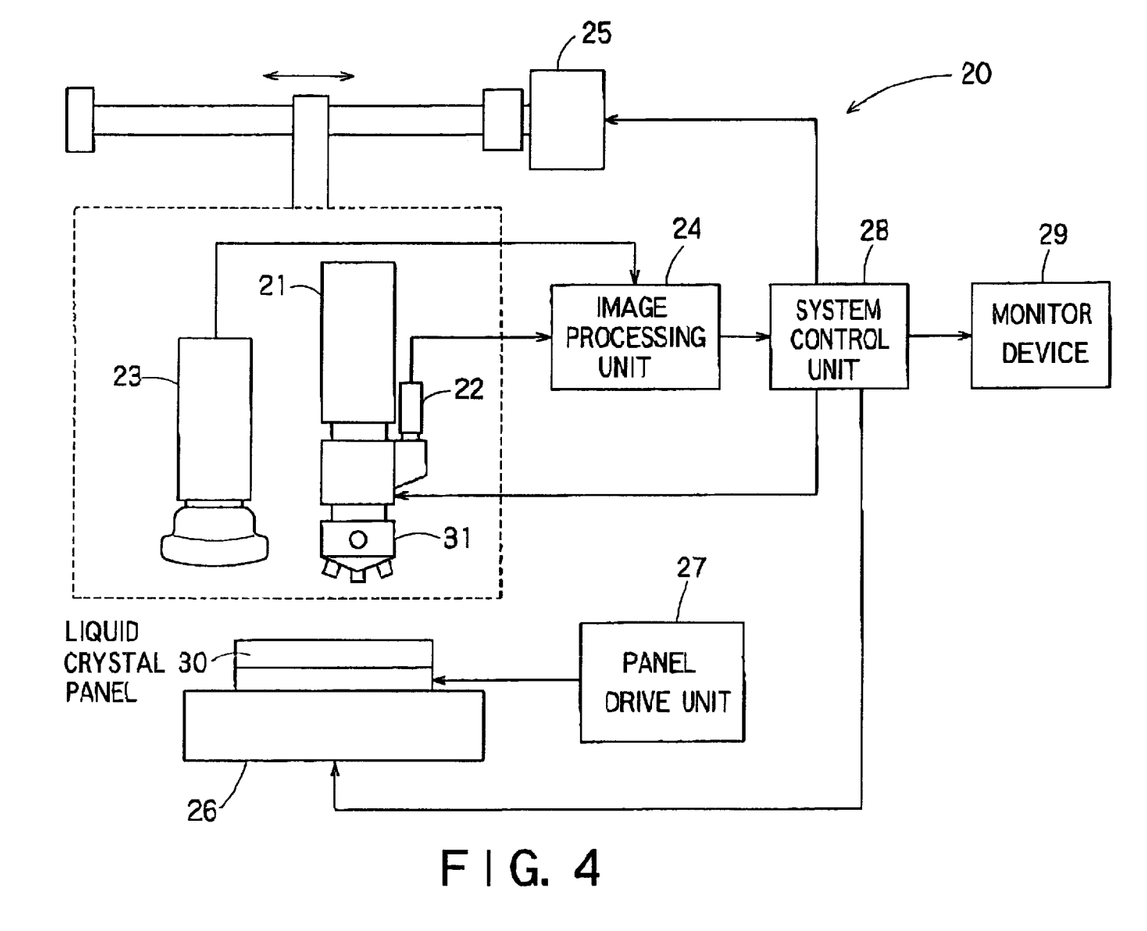
FIG. 4 a block diagram showing a schematic structure of a laser repair apparatus used in an experiment.

FIG. 4 is a block diagram showing a schematic structure of a laser repair device used in the experiment. The laser repair device shown in FIG. 4 includes a laser bean irradiation unit 21, a CCD for repair 22, a CCD for image processing 23, an image processing unit 24, an optical system moving unit 25; an inspection stage 26, a panel drive unit 27, a system control unit 28, and a monitor device 29.

The laser beam irradiation unit 21 irradiates with a laser beam a liquid crystal panel 30 which is to be repaired, and a microscope unit 31 having a plurality of objectives replaceably arranged is provided to an end of the unit 21. The operations of the laser beam irradiation unit 21 and the microscope unit 21 are controlled by a later-described system control unit 28. The CCD for repair 22 is an image fetching device for fetching an image data an image of a wring pattern of a TFT to be repaired (for example, a TFT constituting an analog switch for writing a video signal line) through the microscope unit 31. The image data fetched by the CCD for repair 22 is transmitted to the image processing unit 24.

The CCD for image processing 23 is an image fetching device for fetching each lighting state or the liquid crystal panel 30 a Rage data and fetches as image data each lighting state of the liquid crystal panel 30 before and after repair. The image data fetched by the CCD for image processing 23 is transmitted to the image processing unit 24.

The image processing unit 24 analyzes the image data transmitted from the CCD for image processing 23 to detect a particle having an abnormal particle size and judges a position and a type of that particle. Here, the position of the particle having an abnormal particle size is represented by positional information (X-Y coordinate value) and the type of the same is represented by identification information of a particle previously registered. The information concerning the position and the type of the particle having an abnormal particle size is transmitted to the system control unit 28.

Further, the image processing unit 24 automatically recognizes existence of the particle having an abnormal particle size by analyzing an image. As a result, a shape to be obtained by repair is designated. The information concerning the recognized particle having an abnormal particle size is transmitted to the system control unit 28, and the laser beam irradiation unit 21 irradiates with a laser beam based on this information.

The optical system moving unit 25 is a device for moving the laser beam irradiation unit 21 and the CCD for image processing 23 in a horizontal direction of the liquid crystal panel 30. The laser beam irradiation unit 21 and the CCD for image processing 23 are arranged at positions two-dimensionally matched on the liquid crystal panel 30 in accordance with the respective operation Steps The operation of the optical system moving unit 25 is controlled by the system control unit 28.

It is to be noted that, in the repair system according to this embodiment, the laser beam irradiation unit 21 and the CCD for image processing 23 may be so configured as to move in the horizontal direction of the liquid crystal panel 30 held at a fixed position. In addition, the liquid crystal display panel 30 may be so structured as to move in the horizontal direction of the laser beam irradiation unit 21 and the CCD for image processing 23 Moreover, both a pair of the laser irradiation unit 21 and the CCD for image processing 23 and the liquid crystal panel 30 may be so constituted as to relatively move in the two dimension, respectively.

The inspection stage 26 is a panel holding device for holding the liquid crystal panel 30 at a fixed position and includes therein a non-illustrated backlight for illuminating the liquid crystal panel 30 from the rear surf ace. As means for mounting the liquid crystal panel 30 on the inspection stage 36, there are the manual mounting operation by an operator or an automatic carrier.

Incidentally, in case of constituting the liquid crystal panel 30 so as to move in the horizontal direction of the laser beam irradiation unit 21 and the CCD for image processing 23, a mechanism capable of moving in an X-Y direction on the plane is provided to the inspection stage 26.

The panel drive unit 27 is a lighting inspection device which connects a non-illustrated probe to an electrode terminal of the liquid crystal panel 30 held on the inspection stage 26 to supply a test signal and lights the backlight so that the liquid crystal panel 30 becomes the lighting state (display state). The operation of the panel drive unit 27 is cooperative with the later-described operation of inspection/repair by the system control unit 28.

The system control unit 28 is a controller for controlling the overall operation of this system and controls the operations of the laser beam irradiation unit 21, the optical system moving unit 25 and the inspection stage 26. Further, this unit 28 judges upon whether repair is possible based on the image data transmitted from the image processing unit 24. The operation of the system control unit 28 will be described in detail later Each of the system control unit 28 and the image processing unit 24 are constituted by a CPU for executing various arithmetic operations, a ROM and a RAM which store commands or data of processing executed by the CPU, and a storage device such as a magnetic disk device.

The monitor device 29 is a display device for displaying the image data or the repair conditions or the repair judgment processing fetched by the CCD for image processing 23 and the CCD for repair 22.

Description will now be given as to the operation for carrying out repair of the liquid crystal panel 30 in the repair system having the above-described structure.

The liquid crystal panel 30 including a defective pixel is held on the inspection stage 26 at a predetermined position by the manual operation or the automatic carrier.

In the panel drive unit 27, the probe is connected to a non-illustrated electrode terminal of the liquid crystal panel 30 held on the inspection stage 26 to supply a test signal to the liquid crystal panel 30. Further, the non-illustrated backlight is turned on so that the liquid crystal panel 30 becomes the lighting state. It is to be noted that the initial operation for setting the liquid crystal panel 30 to the panel drive unit 27 is carried out only once.

Subsequently, in the system control unit 28, the optical system moving unit 25 is controlled to move the CCD for image processing 23 is two-dimensionally matched on the liquid crystal panel 30. Then, the CCD for image processing 23 fetches the light state of the liquid crystal panel 30 as the image data and transmits it to the image processing unit 24. The image processing unit 24 having received this image data analyzes the image data to detect a particle having an abnormal particle size and transmits the information concerning a position and a type of the particle to the system control unit 28.

The system control unit 28 stores the information concerning the position of the particle having an abnormal particle size transmitted from the image processing unit 24 in a non-illustrated storage device and controls the optical system moving unit 25 based on this positional information so that the laser beam irradiation unit 21 is moved so as to be two-dimensionally matched on the particle having an abnormal particle size of the liquid crystal panel 30. Further, the system control unit 28 controls the laser beam irradiation unit 21 based on the information concerning the type of the particle having an abnormal grain diameter transmitted from the image processing unit 24 and executes changing of the laser conditions (power, slits and others) or switching and focusing of the objectives in the microscope unit 31. Here, when the particle having an abnormal particle size is clearly focused, the CCD for repair fetches as the image data an image of a wiring pattern of the particle having an abnormal particle size through the microscope unit 31 of the laser beam irradiation unit 21 and transmits it to the image processing unit 24.

The image processing unit 24 analyzes the transmitted image pattern to automatically recognize existence of the particle having an abnormal grain diameter and transmits information recognized in this process to the system control unit 28. The system control unit 28 controls the laser beam irradiation unit 21 based on the transmitted information concerning the particle having an abnormal grain diameter and irradiates with a laser beam the particle having an abnormal grain diameter to carry out repair. Here, the liquid crystal panel 30 remains to be lighted, and the similar operation is repeatedly executed with respect to all the particles having an abnormal grain diameter included in the liquid crystal panel 30.

Upon completion repair, the system control unit 28 controls the laser beam irradiation unit 21 to move the CCD for image processing 23 so as to be two-dimensionally matched on the liquid crystal panel 30. Then, the CCD for image processing 23 fetches the lighting state of the liquid crystal panel 30 which has been already repaired as image data and transmits it to the image processing unit 24.

The image processing unit 24 analyzes the age data to detect the grain having an abnormal grain diameter as similar to the operation before repair and transmits information concerning its position and type to the system control unit 28.

The system control unit 28 stores the information concerning the position of the grain having an abnormal grain diameter stored before repair with the information concerning the position of the grain having an abnormal grain diameter transmitted after repair and makes a judgment upon whether they coincide with each other.

Here, repair is determined to be unsuccessful when the positions of the grain$ having an abnormal grain diameter before and after repair coincide, and repair is determined to be successful when the grain does not exist at the same position as the grain before repair. The system control unit 28 associates the result of judgment with the liquid crystal panel 30 which was repaired and displays it on the monitor device It is to be noted that the monitor device may display the image data fetched by the CCD for image processing 23 and the CCD for repair or the information such as repair conditions given from the system control unit 28 to the laser beam irradiation unit 21. The laser beam is irradiated from the back side or the glass substrate on which the Tars are formed.

When the intensity of the laser released from the laser beam irradiation unit 21 is too strong, the gate insulating film 3 is damaged and the short circuit occurs between the gate electrode 4 and the source electrode 8. Further, the TFT itself can not operate. Therefore, in this embodiment, the intensity of the laser was set to be very weak so that the laser does not affect the part below the rear surface of the polycrystalline silicon. According to the experiment, when the laser intensity was set within a range of 0.22 $\mu$J to 0.06 $\mu$J, the optimum result was obtained. On the other hand, it was found that the locally formed TFT did not have the sufficiently high resistance when the laser intensity was not more than 0.06 $\mu$J and, on the contrary, the gate insulating film 3 started to be broken when the laser intensity was not less than 0.22 $\mu$J.

The present applicant also confirmed a laser irradiation length optimum for restricting abnormality of the threshold value of the TFT by the abnormal region formed locally.

Figure 5A:
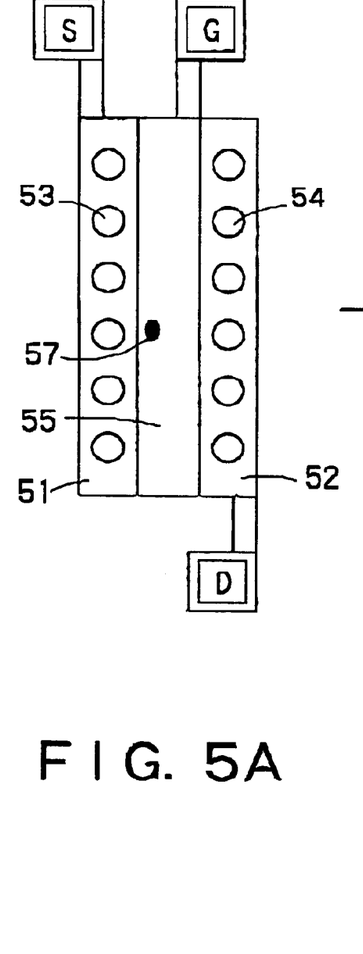
FIGS. 5A and 5B are views showing an appearance of a rear surface of a TFT before and after irradiation with a laser beam.
Figure 5B:
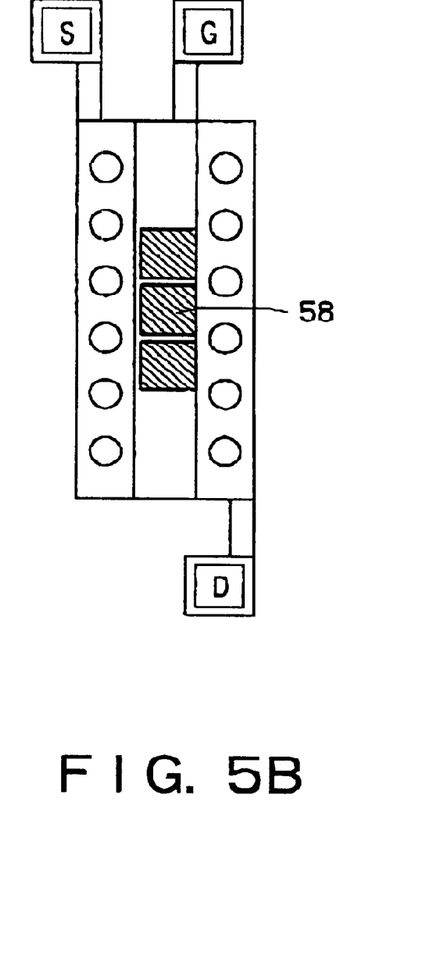

FIGS. 5 are views showing the appearance of the rear surface of the TFT for an analog switch before and after irradiation of the laser, wherein FIG. 5A shows the appearance before irradiation of the laser, and FIG. 5B shows the appearance after irradiation of the laser. As shown in FIG. 5A, when the particle having an abnormal grain diameter is generated in the channel region 55 as shown in FIG. 5A, a process generation temperature therearound varies, and the region in which there is no particle having an abnormal grain diameter and the region having the threshold value different from the former region are formed in the TFT.

On the other hand, as shown in FIG. 5B, when the particle having an abnormal grain diameter is irradiated with the laser, the particle is turned into a granule to have a high resistance, and the operation of the TFT during the off state in normalized. The region 58 indicated by diagonal lines in FIG. 5B is a region which is irradiated with the laser. According to the experiment conducted by the present applicant, the optimum laser irradiation length was 5 μm to 15 μm.

When the laser irradiation length is too short, the abnormal operation of the TFT having an abnormal threshold value by the abnormal region can not be prevented. Further, when the irradiation length is too long, the analog switch loses the normal characteristic.

Since the experiment has revealed the optimum laser irradiation length, the TFT may be designed so that the current Ids between the drain and the source is not influenced by the laser irradiation. Also, taking the irregularity in characteristic of the TFT into consideration can avoid deterioration of the characteristic of the TFT due to irradiation with the laser.

When the laser irradiation is carried out so that a part in the channel region has a high resistance, the transistor operation is restricted around the laser irradiation position (part indicated by diagonal lines in FIG. 5B). However, since a plurality of source-drain contacts 53 and 54 are provided to the TFT for the analog switch so that the large current can flow as shown in FIG. 5B, there may occur no special damage even if that part can not be used. Moreover, it is further desirable that repair is estimated to conduct excessive design in advance when designing the TFT.

Figure 6:
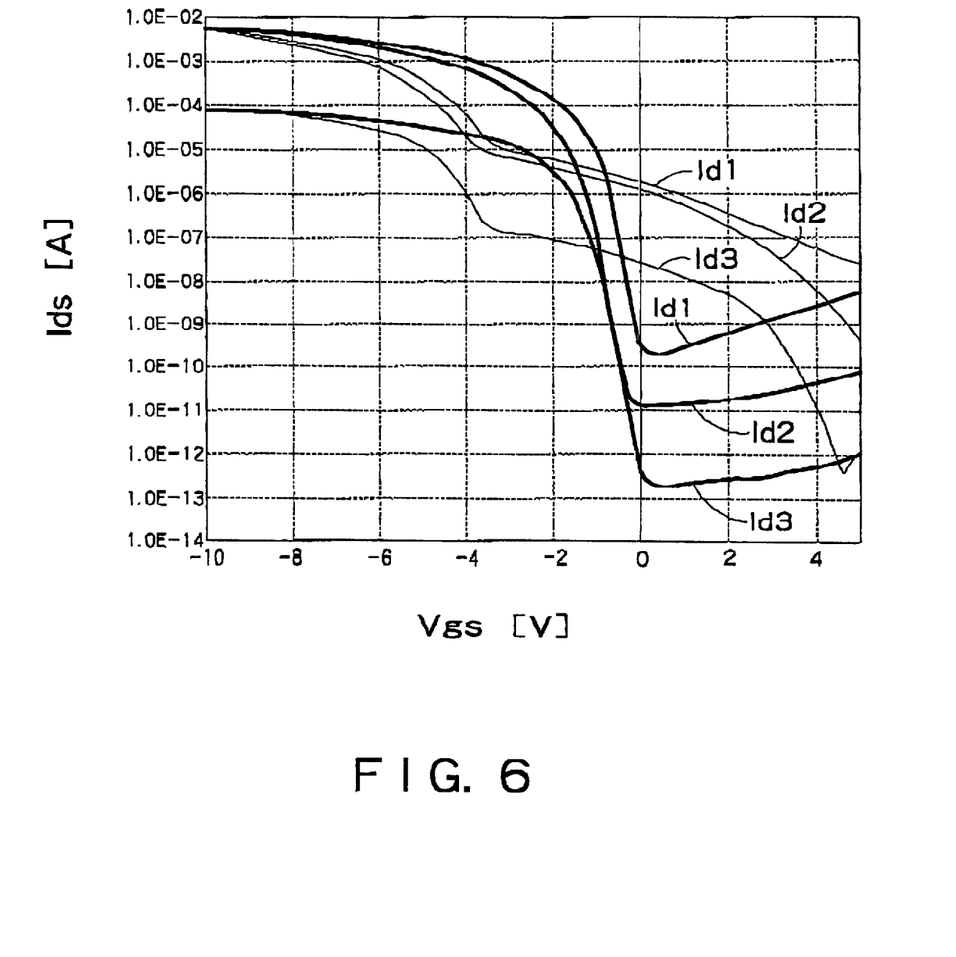
FIG. 6 is a view showing a vg-Id characteristic of the TFT before and after irradiation with a laser beam having an optimum laser intensity and laser irradiation length.

FIG. 6 is a view showing a static characteristic of the TFT before and after irradiating with the laser having optimum laser intensity and laser irradiation length. In FIG. 6, thin curves indicate the static characteristic before irradiation while heavy curves indicate the static characteristic after irradiation. For example, in Id2 of FIG. 6, it can be understood that the off current not less than $10^{-6}$ A flows in the vicinity of the threshold value (Vgs=0 V in FIG. 6) and the off current in the vicinity of the threshold value is $10^{-11}$ A after irradiation Although the ON current is approximately 95% of that before the laser irradiation it is unclear because of the logarithmic graph.

As described above, in the present embodiment, in case of performinq the crystallization process for converting the amorphous silicon layer formed on the glass substrate 1 into the polycrystalline silicon, if the particle having an abnormal grain diameter is produced in the polycrystalline silicon layer under the influence of the foreign particle such as a glass hole in the glass substrate 1, that particle is turned into a granule by the laser to impart the high resistance therearound, and the leak current during the off state of the TFT can be hence suppressed, thereby improving the display characteristic In the above-described embodiment, although the example where irradiation is made with the second harmonic having the wavelength 532 nm of the YAG laser is explained, a type of the laser or an oscillation wavelength is not limited to the above-mentioned one. As other types of the laser, for example, a fourth harmonic having the wavelength 266 nm of the YAG laser or the excimer laser having the wavelength of 282 nm can be applicable. That is, any laser can be used as long as the crystallinity in the channel region is changed by the laser irradiation to have a high resistance. It is, however, desirable that optimum laser intensity or laser irradiation length is set in accordance with a wavelength of the laser to be used.

Although the above-mentioned embodiment has been described by using the liquid crystal display or the semiconductor circuit, the present invention is not limited to the embodiment. The present invention is also applicable to the semiconductor circuit having an EL (electroluminnescence) element. Furthermore, although an example of forming the semiconductor on the glass substrate has been described, the substrate may be Si wafer and the like.

In each of the above embodiments, the example where the constituting the analog switch for driving a signal line has been explained, the similar technique may be used to repair any other TFT (for example, a TFT for pixel display) in the liquid crystal display.

Although description has been given on the method for manufacturing the livid crystal display in each of the above-mentioned embodiments, the present invention can be applied to methods for manufacturing various semiconductor circuits other than the liquid crystal display.

Second Embodiment

A second embodiment relates to a method for manufacturing a semiconductor circuit formed on a Si wafer. More specifically, the second embodiment uses an ion beam released from an FIB (Focused Ion Beam) device to remove a defect detected region within the channel region of the TFT.

The FIB device is generally used for irradiating a wafer with an ion beam to carry out the processing and the like of a wiring region.

The semiconductor circuit according to this embodiment is manufactured in the processes similar to those shown in FIG. 3 except that a silicon substrate is used instead of the glass. After manufacturing the TFT substrate, the inspection process is carried out by using a memory tester, and the repair processing with respect to the defective TFT using the FIB is carried out in this inspection process.

Figure 7:
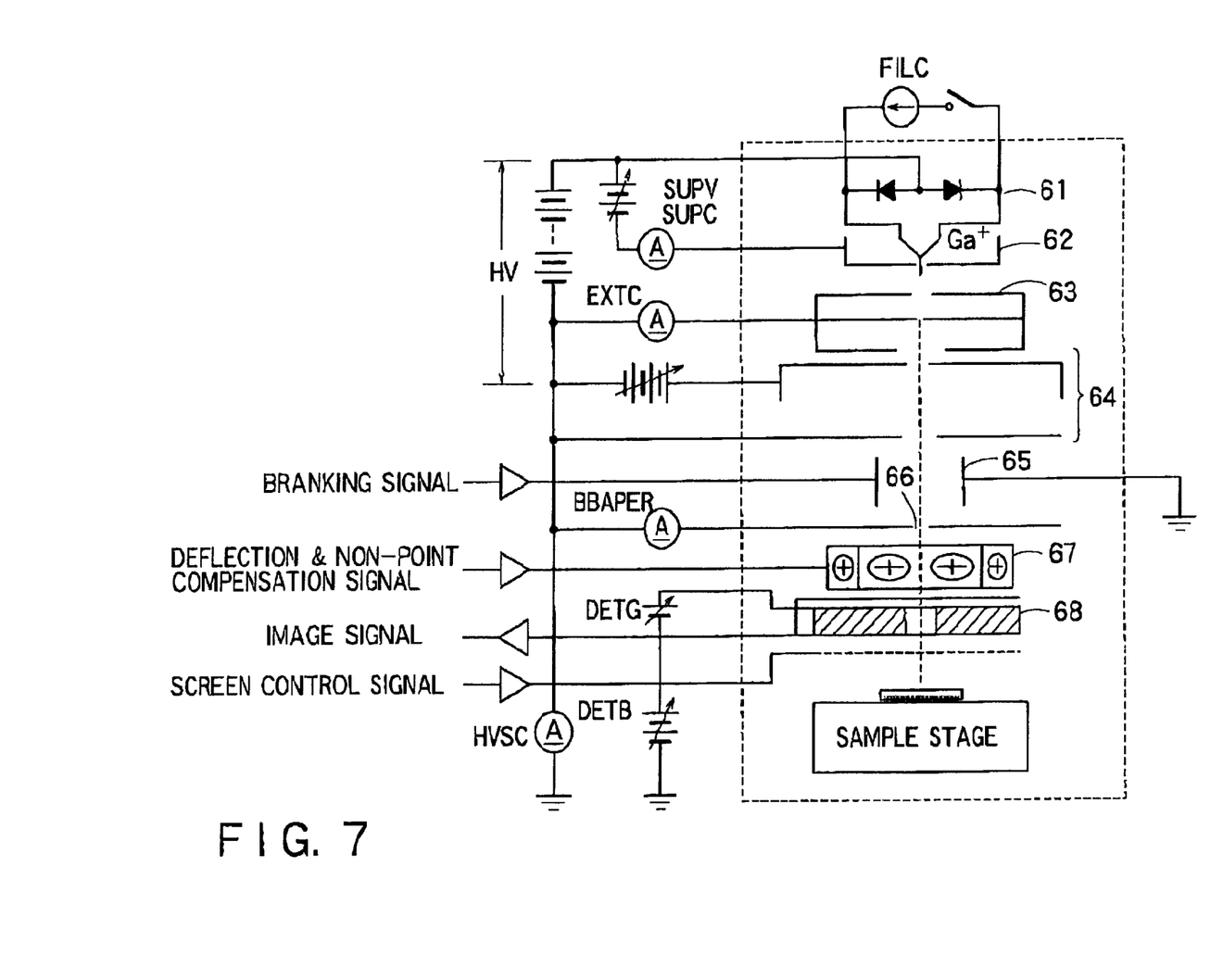
FIG. 7 is a block diagrams showing a schematic structure of an FIB device

FIG. 7 is a block diagram showing the schematic structure of the FIB device. The FIB device shown in FIG. 7 includes an ion gun 61 emitting an ion beam, a suppressor electrode 62, an extraction electrode 63, a lens electrode 64, a blanking plate 65, a blanking aperture 66, an octopole deflector 67, and a detector 68.

An electrostatic lens is used for the lens of the FIB device. A needle is attached to the end portion of the ion gun 61, and there is a specimen bank in the root of the needle, in which a metal to be ionized is accommodated. This metal is accelerated to be fused and continuously supplied to the needle end. This metal is drawn to the emitter end while keeping the fused state of this metal, and a positive voltage is applied to the suppressor electrode 62. Then, a negative pressure is generated to the liquid surface at the emitter end due to an electrostatic field, and the liquid is grown in the form of a circular cone when this pressure exceeds the contractive force owing to the surf ace tension. The diameter of the end of this circular cone keeps to be reduced and, when the field intensity becomes several tens V/nm, the surface atom is ionized in the field evaporation process. With such a principle, the FIB device has such a characteristic that it can accurately irradiate a target position with the ion beam When the abnormal current is detected in the inspection process conducted after manufacture of the TFT substrate, and a partial region having a different threshold value, that is, the abnormal region is detected in the channel region of the TFT in a repair process using the FIB, the ion beam from the FIB device shown in FIG. 7 irradiates this abnormal region from the TFT side of the substrate. As a result, the abnormal region can be physically removed.

When a part of the channel region is physically removed by the FIB device, that part can not be used as the channel region, but the operation of the TFT can not be adversely affected in particular if the channel region is widely formed on the safe side in advance.

As described above, in the second embodiment, since the ion beam released from the FIB device physically removes a defect detected region in the channel region of the TFT, there occurs no problem such that the TFT has a plurality of threshold values ., thereby stabilizing the characteristic of the TFT. Further, since the FIB device can accurately irradiate a target position with the ion beam and has a small bean diameter, only a limited region in the vicinity of the abnormal region can be accurately removed.

Incidentally, although description has been given as to the example where the TFT is formed on the silicon substrate in the foregoing embodiment, the FIB device may irradiate, with the ion beam, a defect detected region of the TFT formed on the glass Substrate as similar to the first embodiment.

What is claimed is:

1. A method for manufacturing a semiconductor circuit incorporating
   a semiconductor layer including a channel region, and source and drain regions arranged via said channel region over a substrate,
   a gate electrode arranged on said channel region via an insulating film,
   a source electrode electrically connected to said source region and
   a drain electrode electrically connected to said drain region,
      said method including a step of selectively irradiating a partial region in said channel region of said semiconductor layer with an energy beam to change the crystallinity.

2. The method for manufacturing a semiconductor circuit according to claim 1, wherein said step for changing the crystallinity of said partial region controls a threshold value of said semiconductor circuit by irradiation of said energy beam.

3. The method for manufacturing a semiconductor circuit according to claim 1, wherein said semiconductor layer is poly silicon crystallized from amorphous silicon.

4. The method for manufacturing a semiconductor circuit according to claim 3, wherein a grain diameter in said partial region of the semiconductor layer is larger than that in any other on region .

5. The method for manufacturing a semiconductor circuit according to claim 3, wherein a grain diameter in said partial region of said semiconductor layer becomes smaller than that in said any other region by irradiation of said energy beam.

6. The method for manufacturing a semiconductor circuit according to claim 1, wherein said semiconductor circuit is a thin film transistor constituting an analog switch for driving a signal line.

7. The method for manufacturing a semiconductor circuit according to claim 1, wherein said energy beam is a laser.

8. The method for manufacturing a semiconductor circuit according to claim 7, wherein said energy beam is a second harmonic of YAG laser, a fourth harmonic of YAG laser or excimer laser.

9. The method for manufacturing a semiconductor circuit according to claim 7, wherein said substrate is a transparent substrate.

10. The method for manufacturing a semiconductor circuit according to claim 9, wherein a grain diameter in said partial region of said semiconductor layer is larger than that in any other region.

11. The method for manufacturing a semiconductor circuit according to claim 9, wherein a grain diameter in said partial region of said semiconductor layer can be set smaller tan that in said any other region by irradiation with an energy beam.

* * * * *